US008580036B2

(12) United States Patent
Friestad

(10) Patent No.: US 8,580,036 B2
(45) Date of Patent: Nov. 12, 2013

(54) METHOD AND APPARATUS FOR REFINING A MOLTEN MATERIAL

(75) Inventor: Kenneth Friestad, Kristiansand (NO)

(73) Assignee: Elkem Solar AS, Oslo (NO)

( * ) Notice: Subject to any disclaimer, the term of this patent is extended or adjusted under 35 U.S.C. 154(b) by 1060 days.

(21) Appl. No.: 11/916,898

(22) PCT Filed: May 10, 2006

(86) PCT No.: PCT/NO2006/000174
§ 371 (c)(1),
(2), (4) Date: Dec. 7, 2007

(87) PCT Pub. No.: WO2006/132536
PCT Pub. Date: Dec. 14, 2006

(65) Prior Publication Data
US 2008/0196209 A1 Aug. 21, 2008

(30) Foreign Application Priority Data

Jun. 10, 2005 (NO) .................................. 20052832

(51) Int. Cl.
C30B 15/22 (2006.01)
(52) U.S. Cl.
USPC ......... 117/206; 23/295 R; 422/245.1; 117/11; 117/13; 117/15; 117/16; 117/23; 117/26; 117/35; 117/48; 117/81; 117/200; 117/208; 117/209; 117/211; 117/217; 117/218; 117/220; 117/222

(58) Field of Classification Search
USPC ........... 117/11, 13, 23, 26, 35, 48, 81, 15–16, 117/200, 206, 208–209, 211, 217–218, 220, 117/222, 922, 931–932; 23/295 R; 422/245.1
See application file for complete search history.

(56) References Cited

U.S. PATENT DOCUMENTS

| 4,190,630 | A | * | 2/1980 | Apilat et al. | ................... 117/217 |
| 4,659,421 | A | * | 4/1987 | Jewett | .............................. 117/21 |
| 4,747,906 | A | * | 5/1988 | Shingu et al. | .................... 23/301 |
| 5,567,399 | A | | 10/1996 | Von Ammon et al. | |
| 5,736,096 | A | * | 4/1998 | Otsuka et al. | ................. 266/205 |
| 6,036,776 | A | | 3/2000 | Kotooka et al. | |
| 6,413,313 | B1 | * | 7/2002 | Yoshida et al. | ............... 117/200 |
| 6,824,611 | B1 | | 11/2004 | Kordina et al. | |
| 2002/0000187 | A1 | * | 1/2002 | Iino | ................................ 117/13 |
| 2002/0174825 | A1 | * | 11/2002 | Wehrhan | ......................... 117/81 |

FOREIGN PATENT DOCUMENTS

| EP | 0303409 A | | 2/1989 |
| JP | 11172345 | * | 6/1996 |
| JP | 8295964 | | 11/1996 |
| JP | 2001106596 A | | 4/2001 |
| JP | 2004-331429 | * | 11/2004 |

OTHER PUBLICATIONS

Translation of Office Action dated Feb. 1, 2006 in Norwegian Patent Application No. 20052832.

(Continued)

Primary Examiner — Michael Kornakov
Assistant Examiner — Kenneth A Bratland, Jr.
(74) Attorney, Agent, or Firm — Lucas & Mercanti, LLP

(57) ABSTRACT

The method and apparatus includes a vessel having a bottom and sidewalls arranged to house the material in a molten state. A temperature controlled horizontally oriented, cooling plate is movable into and out of the top of the molten material. When the cooling plate is lowered into the top of the melt, an ingot of solid silicon is solidified downwards.

16 Claims, 3 Drawing Sheets

(56) References Cited

OTHER PUBLICATIONS

Translation of Office Action dated Mar. 23, 2007 in Norwegian Patent Application No. 20052832.

International Preliminary Report on Patentability PCT/NO2006/000174 dated Sep. 20, 2007.
International Search Report PCT/NO2006/000174 dated Sep. 26, 2006.

* cited by examiner

METHOD AND APPARATUS FOR REFINING A MOLTEN MATERIAL

FIELD OF INVENTION

The present invention is concerned with refining or purifying a material which can be melted and solidified. It is particularly, but not exclusively, applicable to the purification of metals, especially silicon, for example refining of silicon feedstock for the manufacture of solar cells.

BACKGROUND ART

Directional solidification is widely used in the Photo Voltaic [PV] industry to produce ingots, which are sliced into wafers and later processed to become solar cells. The current state of the art is dominated by a system where silicon is solidified directionally from the bottom to the top in a crucible of quartz.

The same principle can be used to refine silicon to produce feedstock for the PV industry. The directional solidification can then be used to control the impurities by segregation, both the absolute levels and relative levels of different elements (Al, Ca, Fe, Ti, Mn, B, P, etc.) can be adjusted. In addition, the process has to take into account the particles formed in the process and particles from the incoming silicon.

A disadvantage of today's approach is that the quartz crucible can be used only once, since it is destroyed due to a phase transition of the crucible material during cool down of the silicon ingot (and the crucible). In addition, an anti-sticking layer of, for example, $Si_3N_4$ is required for the quartz crucible approach, in order to avoid adhesion of the silicon.

It is an object of the invention to provide an improved solidification process which results in a reduced contamination of the ingot cast.

It is a further object of the invention to provide a system which can refine a molten material, such as silicon, without the need to replace the container for the molten material between the casting of each ingot.

DESCRIPTION OF THE INVENTION

According to one aspect of the invention, there is provided a method of refining a material which comprises the steps of: forming a melt of the material in a vessel; bringing a cooled surface into contact with the surface of the melt, allowing the molten material to solidify and adhere to the cooled surface; and progressively solidifying the molten material downwards to form a solid ingot of the material adhering to the cooled surface.

Although defined as a method of refining, the invention could also be considered to be a method of directional solidification.

Thus, the invention provides a streamlined production process in which the furnace vessel is heated and the ingot cast, but there is no ingot contact within the vessel and so the ingot can be removed and the vessel refilled. The vessel does not need to be cooled between ingot castings.

Preferably, the walls and bottom of the vessel are heated. Preferably, the melt is maintained in an inert or controlled atmosphere. The method is particularly suitable for the refinement and purification of metals, such as silicon.

The method has the advantage that the impurity level in the ingot decreases relative to the remainder of the melt, as the ingot forms. Then the ingot is removed from the vessel or crucible and the remaining liquid with high impurity content is poured off and possibly reprocessed. The vessel does not have to be destroyed and can be re-used. The nucleation site is simplified from a crucible to a surface of a plate or several plates arranged side by side. The plate or the plates arranged side by side consist of several plates in a layered structure. The cooled surface may be formed with discontinuities to help ensure adhesion of the ingot.

Thus, by adopting the invention, the refining process is optimised in several ways.

Segregation is used to refine and control the metallic impurities. The impurities will be pushed from the interface between solid and liquid silicon and into the bulk liquid. A required resistivity of the refined material can be obtained by segregation and doping (before or during the casting). The absolute resistivity level will be determined by end-user process and requirements.

Particles with higher density than molten silicon are removed. The particles that are brought into or formed during the directional solidification will settle to the bottom if they have a density that is sufficiently higher than molten silicon. They can form a dense layer at the bottom of the molten bath.

Particles with a density, lower or little higher, than silicon can also be removed. They will be pushed in front of the interface between the solid and molten silicon. These particles will follow the convective flow pattern in the vessel if they are pushed sufficiently out into the bulk liquid.

The solidification process may be optimised by combining forces that move the impurities with flow patterns and settling forces. Molten silicon with a high content of impurities with high density will flow from the solidification interface towards the bottom. A similar picture will occur for the heavy particles, while particles with little or no difference in density will follow the flow in the vessel. These mechanisms can be optimised more easily if solidification takes place from the top of a bath to bottom.

The directional solidification from top to bottom is therefore better able to control the impurities than by growing from the bottom of a molten bath. The solidification can be carried out until a given fraction is solidified (a given ingot height or size is obtained). The remaining silicon liquid will contain a higher proportion of impurities and heavier particles than the starting material and can be transferred from the container by pouring etc. The main particulate impurities tend to be SiC, $Si_xN_y$ or $Si_xO_yN_z$.

According to another aspect of the invention, there is provided apparatus for refining a material, which comprises a vessel having a bottom and sidewalls arranged to house the material in a molten state and a cooled plate which is movable into and out of the top of the vessel.

Preferably, the vessel has heated walls and/or bottom. Preferably, the walls and/or bottom of the vessel are made from a heat conductive but chemically inert and temperature resistant materials such as graphite, silicon nitride, silicon carbide, silica, alumina, silicon oxynitride or other ceramic oxides.

Preferably, the cooling plate includes a plurality of layers including a heat conductive layer in operative contact with cooling means, and a contact layer for making contact with the molten material. Preferably, the contact layer and any intermediate layer are made from heat conductive but chemically inert and temperature resistant materials such as graphite, silicon nitride, silicon carbide, silica, silicon oxynitride, alumina or other ceramic oxides. The heat conductive layer may be of a metal, such as copper, aluminium or some suitable alloy. In addition, a heating layer such as a layer of electric resistance heating elements or an induction heated layer may be incorporated in between the other layers. This may provide better control of the cooling process.

The plate may include an intermediate layer which is attached to the conductive layer and which may form a sliding or snap fit with the contact plate. There is preferably a gas-tight cover over the vessel to maintain the inert or controlled atmosphere.

SHORT DESCRIPTION OF THE DRAWINGS

The invention may be carried into practice in various ways and some embodiments will now be described by way of example with reference to the accompanying drawings, in which.

DETAILED DESCRIPTION OF THE INVENTION

Figure 1:
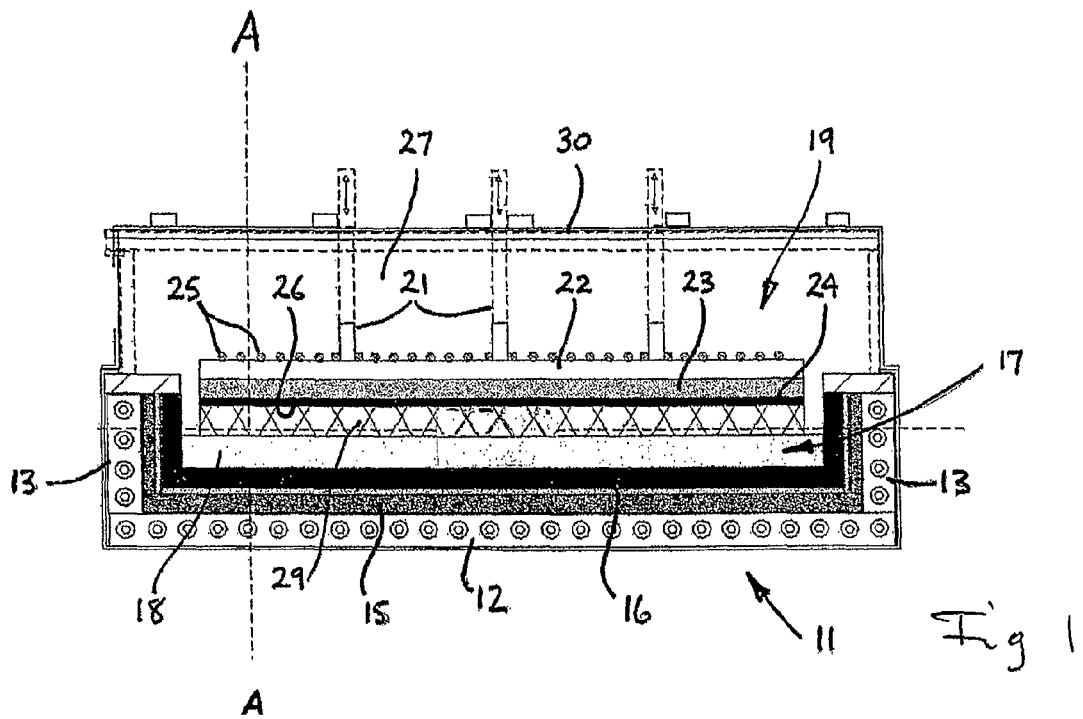
FIG. 1 is a vertical section through an apparatus for carrying out the invention.
Figure 2:
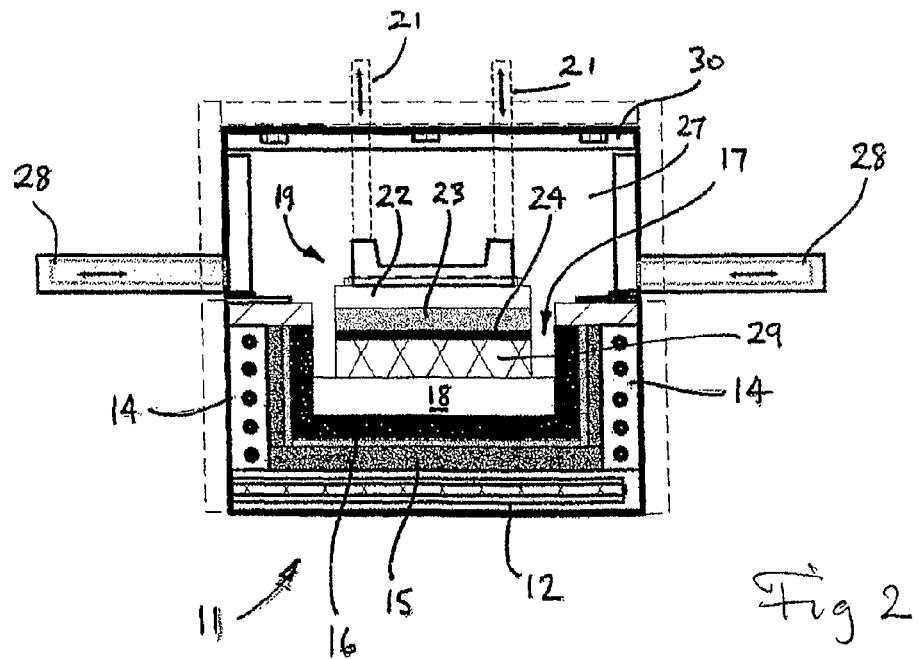
FIG. 2 is a section on the line AA in FIG. 1.

FIGS. 1 and 2 show an apparatus for the directional solidification of molten silica. The apparatus comprises a vessel 11 with a heated bottom 12, heated end walls 13 and heated side walls 14. The vessel 11 is lined with an outer lining 15 and an inner lining 16. The material for those linings should be heat conductive but chemically inert and temperature resistant, and suitable materials include graphite, silicon carbide, silicon nitride, silica, alumina, silicon oxynitride or other ceramic oxides. The inner lining 16 defines an enclosure 17 for a silicon melt 18.

Above the enclosure 17 and melt 18, there is a temperature controlled plate 19. The plate 19 is suspended from supports 21 and comprises a conductive layer 22, an intermediate insulating layer 23 and a contact layer 24. The conductive layer 22 has a series of cooling pipes 25 and the contact layer 24 has a roughened contact surface 26.

The conductive layer 22 is typically made from a conductive metal such as copper or aluminium. The cooling medium in the pipes 25 is any suitable liquid/gas, such as water or oil. The insulating layer 23 and contact layer 24 are made from a heat conductive but temperature resistant and chemically inert material, such as graphite, silicon carbide or silicon nitride.

The vessel 11 and plate 19 are covered by a gas-tight cover 30. This houses an inert atmosphere 27 above the melt 18. There are also two insulated doors 28 which can be deployed over the enclosure 17 if the cover 30 is removed.

In use, silicon is placed in the enclosure 17 and heated by means of the heated bottom 12 and walls 13, 14 until it forms a melt 18. Alternatively, molten silicon can be charged directly into the enclosure 17. The plate 19 is lowered so that contact surface 26 is slightly submerged beneath the surface of the melt 18. The cooling effect applied to the plate 19 from the pipes 25 causes the silicon melt 18 to solidify and adhere to the contact surface 26, forming an ingot 29 of solid silicon.

The plate 19 is then raised so that it is above the level of the melt 18 but the ingot 29 is still submerged. Further cooling then causes more of the silicon melt 18 to solidify, with the result that the ingot 29 grows downwards.

When the ingot 29 has reached the required size, it is raised clear of the enclosure 17 and removed. The enclosure 17 is re-charged with silicon and the insulated doors 28 are deployed over the enclosure to maintain the molten state of the silicon. Meanwhile, the silicon ingot 29 and contact layer 24 are removed from the plate 19 for use in further manufacture, either to ingots for remelting to produce ingots for the manufacture of wafers for solar cells or for the direct manufacture of wafer for solar cells. The contact layer 24 is replaced and process is repeated.

It will be understood that impurities heavier than molten silicon will fall away from the ingot 29 in the melt 18, while lighter contaminants will circulate within the melt, due to convection forces. In this way, the impurities and contaminants present in the melt 18 will tend to remain in the melt 18 and will not be captured within the ingot 29. This will have the effect of purifying the silicon forming the ingot 29. It will also, in turn, have the effect of concentrating the impurities and contaminants in the remaining melt 18. For that reason, this molten silicon remaining after withdrawal of the ingot 29 may be removed and replaced with fresh silicon.

Figure 3:
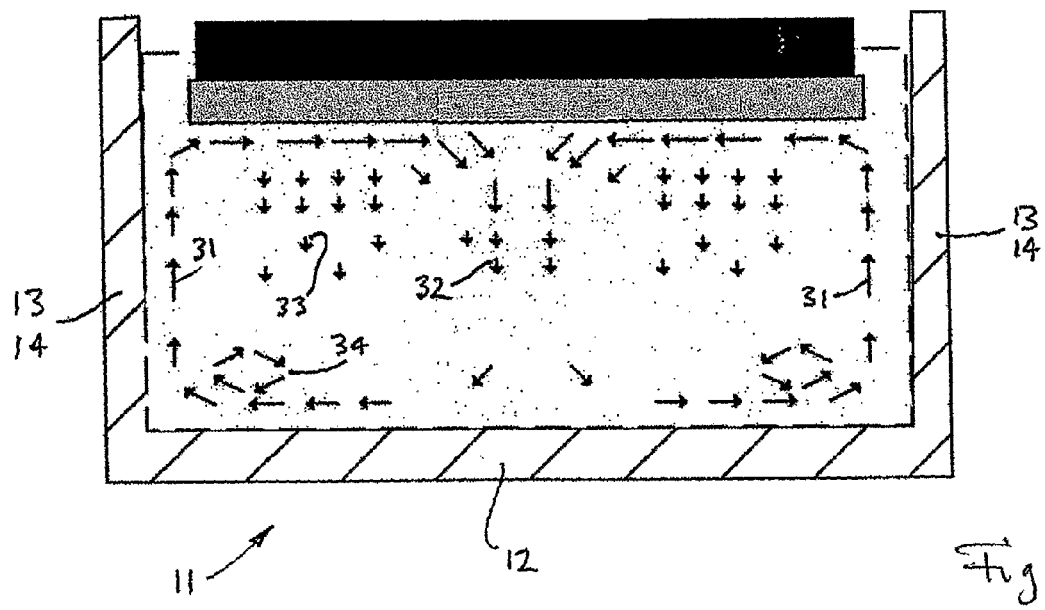
FIG. 3 is a schematic section showing possible corrective flow patterns in the molten material.

The direction of circulation of the molten silicon in the melt 18 is shown in FIG. 3. The arrows show the movement due to convective forces. The liquid silicon at the heated walls 13,14 is less dense and flows upwards 31. It cools on contact with the ingot 29 and flows down 32 in the middle of the melt 18, where it is furthest away from the source of heat. The denser impurities tend to fall 33 and form eddies 34 at the bottom 12 near the walls 13,14.

Figure 4:
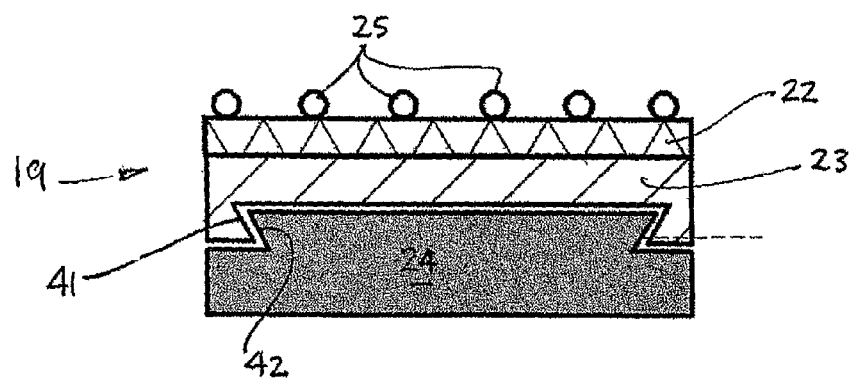
FIG. 4 is a schematic section through a temperature controlled plate according to one embodiment.

FIG. 4 shows a preferred form for the plate 19. The conductive layer 22 is formed of copper and includes cooling pipes 25. The intermediate layer 23 is formed with an undercut profile 41 along each longitudinal edge. The contact layer 24 is formed with a corresponding overhang profile 42 along each longitudinal edge. The contact layer 24 is simply slid into the intermediate layer 23, with the overhang profiles 42 supported on the undercut profiles 41.

It will be understood that this arrangement provides little conductive heat transfer between the two plates, since contact is along two relatively narrow lines. It may therefore provide a slow cooling effect on the ingot, providing time for the required crystal orientation in the ingot as the material solidifies.

Figure 5:
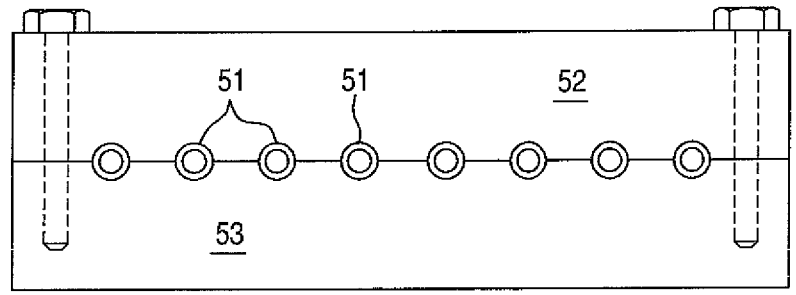
FIGS. 5 and 6 are views similar to FIG. 4, showing two alternative embodiments.

FIG. 5 shows an alternative arrangement in which cooling tubes 51 are located between an upper layer 52 and intermediate layer 53. Both layers 52,53 may be formed of graphite, silicon carbide, silicon nitride, or the like.

Figure 6:
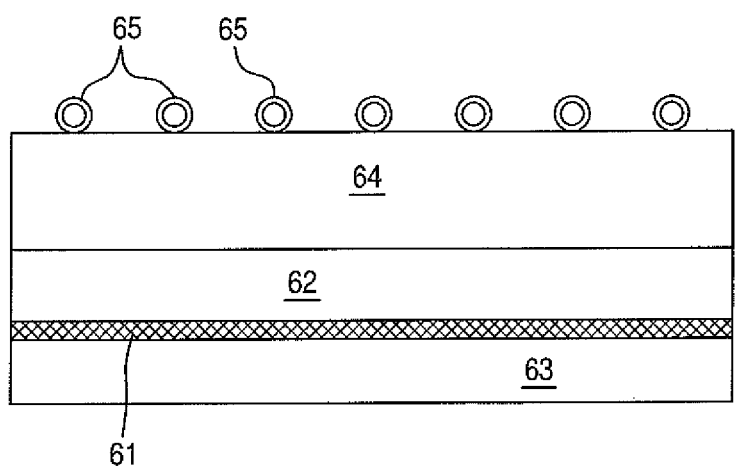

FIG. 6 shows an alternative arrangement which includes a heated layer 61 located between two intermediate layers 62 and 63. A conductive layer 64 with cooling pipes 63 are located above the intermediate layers 62,63. This arrangement may provide an improved temperature control and also allows the contact layer (not shown) to be raised to a temperature above the melting point of silicon prior to immersion. This avoids undesired chilling of the silicon melt in the initial stages of solidification.

It will be understood that while the preferred embodiments have been described with reference to silicon, the invention is applicable to the directional solidification (and refinement) of other materials.

The invention claimed is:

1. A method of refining a material, which comprises the steps of:

forming a melt of the material in a vessel;

lowering a vertically, progressively movable temperature controlled horizontal plate having at least three horizontal layers comprising a bottom contact layer, a top heat conductive layer and a first intermediate layer between the top heat conductive layer and the bottom contact layer, the bottom layer forming a horizontal contact surface, the plate vertically, progressively movable into and out of the top of the vessel; and a plurality of horizontal cooling pipes which are vertically, progressively movable with the heat conductive layer and running parallel to the horizontal contact surface, and slightly submerging the temperature controlled horizontal contact surface beneath the surface of the melt such that the temperature controlled horizontal contact surface is in contact with the melt below the surface of the melt, said temperature controlled horizontal contact surface having no contact with the vessel sidewalls;

allowing the molten material to solidify and adhere to the temperature controlled horizontal contact surface thereby forming a surface of solidified material below the temperature controlled horizontal contact surface;

raising the temperature controlled horizontal contact surface above the level of the melt while leaving the surface of solidified material submerged in the melt; and progressively solidifying the molten material downwards from the surface of solidified material formed below the temperature controlled contact surface while progressively raising the temperature controlled horizontal contact surface above the surface of the melt such that the surface of solidified material remains below the surface of the melt and molten material solidifies onto the surface of solidified material which is below the surface of the melt so as to grow a solid ingot downwards from the horizontal contact surface.

2. The method as claimed in claim 1, in which the temperature controlled horizontal contact surface is cooled.

3. The method as claimed in claim 1, in which the walls and bottom of the vessel are heated.

4. The method as claimed in claim 1, in which the melt is maintained in an inert or controlled atmosphere.

5. The method as claimed in claim 1, in which the liquid material remaining after solidification of the ingot contains a higher level of impurities than the starting material and is removed from the vessel.

6. The method as claimed in claim 1, in which the material is silicon.

7. The method as claimed in claim 6, in which the silicon is doped to provide the required resistivity in the final solidified ingot.

8. An apparatus for refining a material, which comprises:
a vessel having a bottom and sidewalls arranged to house the material in a molten state;
a vertically, progressively movable temperature controlled horizontal plate having at least three horizontal layers comprising a bottom contact layer, a top heat conductive layer and a first intermediate layer between the top heat conductive layer and the bottom contact layer, the bottom layer forming a horizontal contact surface, the plate vertically, progressively movable into and out of the top of the vessel, said temperature controlled horizontal plate having no contact with the vessel sidewalls; and
a plurality of horizontal cooling pipes which are vertically, progressively movable with the temperature controlled horizontal plate, the pipes arranged on top of the top heat conductive layer and running parallel to the horizontal contact surface.

9. The apparatus as claimed in claim 8, in which the vessel has heated walls and/or bottom.

10. The apparatus as claimed in claim 8, in which the vessel is lined with silicon nitride, graphite, silicon carbide, silica, alumina, silicon oxynitride or ceramic oxides.

11. The apparatus as claimed in claim 8, in which the top heat conductive layer is composed of copper, aluminium or alloys of one or both metals.

12. The apparatus as claimed in claim 8, in which the bottom contact layer is composed of graphite, silicon nitride, silicon carbide, silica, alumina, silicon oxynitride or ceramic oxide.

13. The apparatus as claimed in claim 8, wherein the intermediate layer forms a sliding or snap fit with the bottom contact layer.

14. The apparatus as claimed in claim 8, wherein the at least three horizontal layers further comprises a second intermediate layer and a heated layer between the first and second intermediate layer.

15. The apparatus as claimed in claim 8, in which the horizontal contact surface of the plate which contacts the molten material in use is roughened or formed with discontinuities.

16. The apparatus as claimed in claim 8, including a gas-tight cover over the vessel to allow a controlled or inert atmosphere.

* * * * *